(12) United States Patent
Takahashi et al.

(10) Patent No.: US 12,094,710 B2
(45) Date of Patent: Sep. 17, 2024

(54) METHOD OF FORMING NITRIDE SEMICONDUCTOR FILM

(71) Applicants: TOKYO ELECTRON LIMITED, Tokyo (JP); OSAKA UNIVERSITY, Osaka (JP)

(72) Inventors: Nobuaki Takahashi, Tokyo (JP); Hitoshi Miura, Tokyo (JP); Koji Neishi, Nirasaki (JP); Ryuji Katayama, Osaka (JP); Yusuke Mori, Osaka (JP); Masayuki Imanishi, Osaka (JP)

(73) Assignees: TOKYO ELECTRON LIMITED, Tokyo (JP); OSAKA UNIVERSITY, Osaka (JP)

( * ) Notice: Subject to any disclaimer, the term of this patent is extended or adjusted under 35 U.S.C. 154(b) by 0 days.

(21) Appl. No.: 17/219,320

(22) Filed: Mar. 31, 2021

(65) Prior Publication Data

US 2021/0217618 A1 Jul. 15, 2021

Related U.S. Application Data

(63) Continuation of application No. PCT/JP2019/038987, filed on Oct. 2, 2019.

(30) Foreign Application Priority Data

Oct. 9, 2018 (JP) .................................. 2018-191242

(51) Int. Cl.
*C23C 14/00* (2006.01)
*C23C 14/06* (2006.01)
(Continued)

(52) U.S. Cl.
CPC .... *H01L 21/02631* (2013.01); *C23C 14/0641* (2013.01); *C23C 14/34* (2013.01);
(Continued)

(58) Field of Classification Search
CPC ............ C23C 14/0036; C23C 14/0641; C23C 14/34; C23C 14/3485; C23C 14/54;
(Continued)

(56) References Cited

U.S. PATENT DOCUMENTS

| 2001/0017257 A1* | 8/2001 | Choi ....................... C23C 14/34 |
| | | 204/298.16 |
| 2003/0173207 A1* | 9/2003 | Zhang ................. C23C 14/0036 |
| | | 204/192.12 |

(Continued)

FOREIGN PATENT DOCUMENTS

| JP | 2001-35805 A | 2/2001 |
| JP | 2008-270749 A | 11/2008 |

(Continued)

OTHER PUBLICATIONS

Horng et al. "A research on the persistent photoconductivity behavior of GaN thin films deposited by r.f. magnetron sputtering", Thin Solid Films 343-344 (1999) pp. 642-645 (Year: 1999).*

(Continued)

*Primary Examiner* — Rodney G McDonald
(74) *Attorney, Agent, or Firm* — Nath, Goldberg & Meyer; Jerald L. Meyer; Tanya E. Harkins

(57) ABSTRACT

The method of forming a nitride semiconductor film includes intermittently sputtering a target of gallium nitride inside a vacuum chamber containing nitrogen and argon, and depositing sputtered particles of the gallium nitride that are scattered from the target inside the vacuum chamber, on a substrate having a temperature of 560 degrees C. or higher and 650 degrees C. or lower. A ratio of a flow rate of the nitrogen to a sum of the flow rate of the nitrogen and a flow rate of the argon supplied to the vacuum chamber is 6% or higher and 18% or lower.

17 Claims, 3 Drawing Sheets

(51) Int. Cl.
*C23C 14/34* (2006.01)
*H01J 37/34* (2006.01)
*H01L 21/02* (2006.01)

(52) U.S. Cl.
CPC .... *H01J 37/3426* (2013.01); *H01L 21/02458* (2013.01); *H01L 21/0254* (2013.01); *H01J 2237/332* (2013.01); *H01L 21/02389* (2013.01); *H01L 21/0242* (2013.01); *H01L 21/02513* (2013.01); *H01L 21/02576* (2013.01); *H01L 21/02579* (2013.01)

(58) Field of Classification Search
CPC ........... C23C 14/541; H01J 37/3426; H01J 2237/332; H01L 21/02458; H01L 21/0254; H01L 21/02631; H01L 21/02389; H01L 21/0242; H01L 21/02513; H01L 21/02576; H01L 21/02579
USPC ..................................... 204/192.15, 192.25
See application file for complete search history.

(56) References Cited

U.S. PATENT DOCUMENTS

2009/0283795 A1* 11/2009 Miki ................. H01L 21/0237
  438/46
2011/0001163 A1* 1/2011 Sasaki ................. H01L 33/12
  257/E33.033
2014/0346944 A1* 11/2014 Kawakami ............... H01K 1/26
  313/112
2017/0294548 A1* 10/2017 Sato ............... H01L 31/022425

FOREIGN PATENT DOCUMENTS

| | | |
|---|---|---|
| JP | 2012-222243 A | 11/2012 |
| JP | 2018-119171 A | 8/2018 |
| WO | 2010/095681 A1 | 8/2010 |

OTHER PUBLICATIONS

Guo et al. "Heteroepitaxial growth of gallium nitride on (111) GaAs substrates by radio frequency magnetron sputtering", Journal of Crystal Growth 237-239, (2002), 1079-1083 (Year: 2002).*

Shanmugan et al. "Surface and electrical properties of plasma processed RF sputtered GaN thin films", Eur. Phys. J. Appl. Phys. (2014) 68: 30303 (Year: 2014).*

Li et al. "Effects of growth temperature on electrical and structural properties of sputtered of GaN with a cermet target", J. Mater. Sci: Mater Electron (2014) 25: 1404-1409. (Year: 2014).*

Arakawa et al. "Electrical properties of Si-doped GaN prepared using pulsed sputtering", Applied Physics Letters 110, 042103, (2017). (Year: 2017).*

Nahhas et al. "Epitaxial growth of ZnO films on Si substrates using an epitaxial GaN buffer", Appl. Phys. Lett. 78, 1511-1513 (2001) (Year: 2001).*

* cited by examiner

METHOD OF FORMING NITRIDE SEMICONDUCTOR FILM

CROSS-REFERENCE TO RELATED APPLICATIONS

This application is a bypass continuation application of international application No. PCT/JP2019/038987 having an international filing date of Oct. 2, 2019 and designating the United States, the international application being based upon and claiming the benefit of priority from Japanese Patent Application No. 2018-191242, filed on Oct. 9, 2018, the entire contents of which are incorporated herein by reference.

TECHNICAL FIELD

The present disclosure relates to a method of forming a nitride semiconductor film.

BACKGROUND

A gallium nitride (GaN) film is used for a blue light emitting diode (LED) or the like. Characteristics of a gallium nitride film are greatly affected by crystallinity of the film. In general, a gallium nitride film having satisfactory crystallinity is formed through a metal organic chemical vapor deposition (MOCVD) method. In addition, a method of intermittently sputtering a target to form a gallium nitride film has also been proposed (Patent Document 1)

Related Art Document

Patent Document

Patent Document 1: Japanese Laid-Open Patent Publication No. 2008-270749

SUMMARY

According to one embodiment of the present disclosure, a method of forming a nitride semiconductor film includes intermittently sputtering a target of gallium nitride inside a vacuum chamber containing nitrogen and argon and depositing sputtered particles of the gallium nitride that are scattered from the target inside the vacuum chamber, on a substrate having a temperature of 560 degrees C. or higher and 650 degrees C. or lower. A ratio of a flow rate of the nitrogen to a sum of the flow rate of the nitrogen and a flow rate of the argon supplied to the vacuum chamber is 6% or higher and 18% or lower.

According to the present disclosure, it is possible to improve flatness and optical properties.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
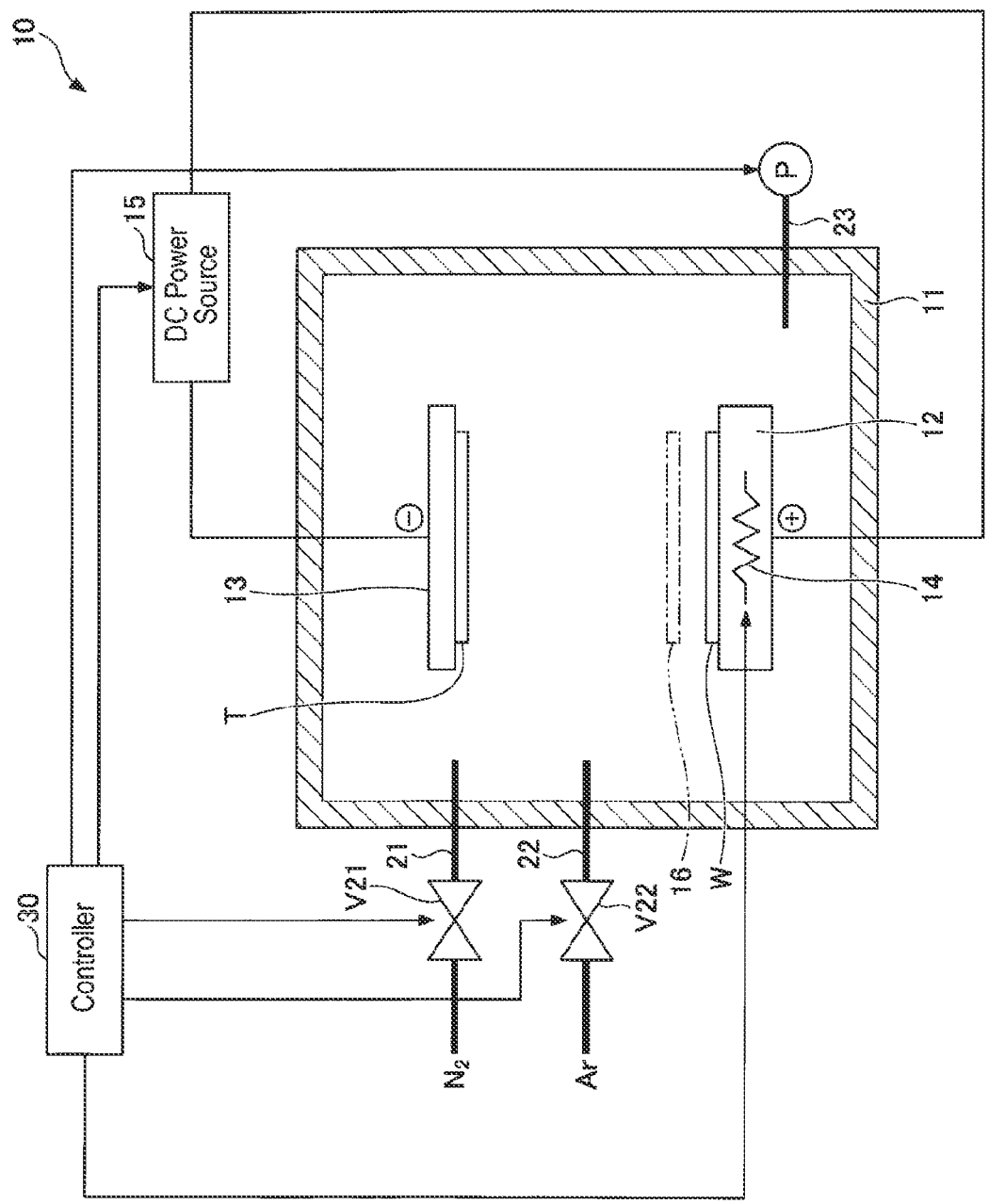
FIG. 1 is a schematic view illustrating a film forming apparatus suitable for forming a gallium nitride film.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In addition, in the specification and drawings, constituent elements having substantially the same functions may be denoted by the same reference numerals and redundant descriptions may be omitted.

The flatness of a gallium nitride film may be evaluated by, for example, a surface roughness RMS (root mean square roughness), and it is desired that the surface roughness RMS is 0.5 nm or less. In addition, optical properties of the gallium nitride film may be evaluated by, for example, a photoluminescence intensity ratio of a band edge wavelength to a yellow band wavelength range, and it is desired that the photoluminescence intensity ratio is 10 or more. The optical properties of the gallium nitride film are particularly affected by the crystallinity of the gallium nitride film itself. Further, the lower the impurity concentration, the better the optical properties that can be obtained. A gallium nitride film having such characteristics can be formed through an MOCVD method, but film formation through the MOCVD method has problems such as a high running cost and large environmental load. Thus, it is desired to form a gallium nitride film having satisfactory properties through another method. According to an embodiment of the present disclosure described below, it is possible to form a gallium nitride film having the above-mentioned characteristics without using the MOCVD method.

Here, a film forming apparatus suitable for forming a gallium nitride film according to an embodiment will be described. FIG. 1 is a schematic view illustrating a film forming apparatus suitable for forming a gallium nitride film.

In the film forming apparatus 10, as illustrated in FIG. 1, a wafer holder 12 configured to hold a wafer W and a cathode 13 to which a target T is attached are provided in a vacuum chamber 11. A shutter 16 that can be opened and closed is provided between the wafer holder 12 and the cathode 13. As the vacuum chamber 11, for example, in some embodiments, a chamber capable of accommodating a high vacuum of $10^{-7}$ Pa or less at 650 degrees C. can be used. As the vacuum chamber 11, a chamber used for film formation through a molecular beam epitaxy (MBE) method may be used. The wafer holder 12 has a built-in heater 14. A top surface of the wafer holder 12 and a bottom surface of the cathode 13 face each other. Therefore, an upper surface of the wafer W held by the wafer holder 12 and a lower surface of the target T attached to the cathode 13 face each other. A DC power source 15 is connected between the wafer holder 12 and the cathode 13. The wafer W is an example of an object.

The vacuum chamber 11 is provided with a nitrogen ($N_2$) gas supply line 21, an argon (Ar) gas supply line 22, and an exhaust line 23. A valve V21 is provided in the supply line 21, a valve V22 is provided in the supply line 22, and a pump P is connected to the exhaust line 23.

The film forming apparatus 10 is provided with a controller 30 configured to control operations of the heater 14, the DC power source 15, the valve V21, the valve V22, and the pump P. The controller 30 is configured with, for example, a computer, and includes a central processing unit (CPU) and a storage medium such as a memory or the like. The storage medium stores a program that controls various processes executed by the film forming apparatus 10. The controller 30 controls an operation of the film forming apparatus 10 by causing the CPU to execute the program stored in the storage medium. In addition, the controller 30 includes an input interface and an output interface. The controller 30 receives a signal from the outside via the input interface and transmits a signal to outside via the output interface.

The above-mentioned program may be stored in a computer-readable storage medium and may be installed in the storage medium of the controller 30 from the computer-readable storage medium. Examples of the computer-readable storage medium include a hard disk (HD), a flexible disk (FD), an optical disk (OD), a magneto-optical disk (MO), a solid-state drive (SSD), a memory card, and the like. Further, the program may be downloaded from a server via the Internet and may be installed in the storage medium of the controller 30.

Figure 2:
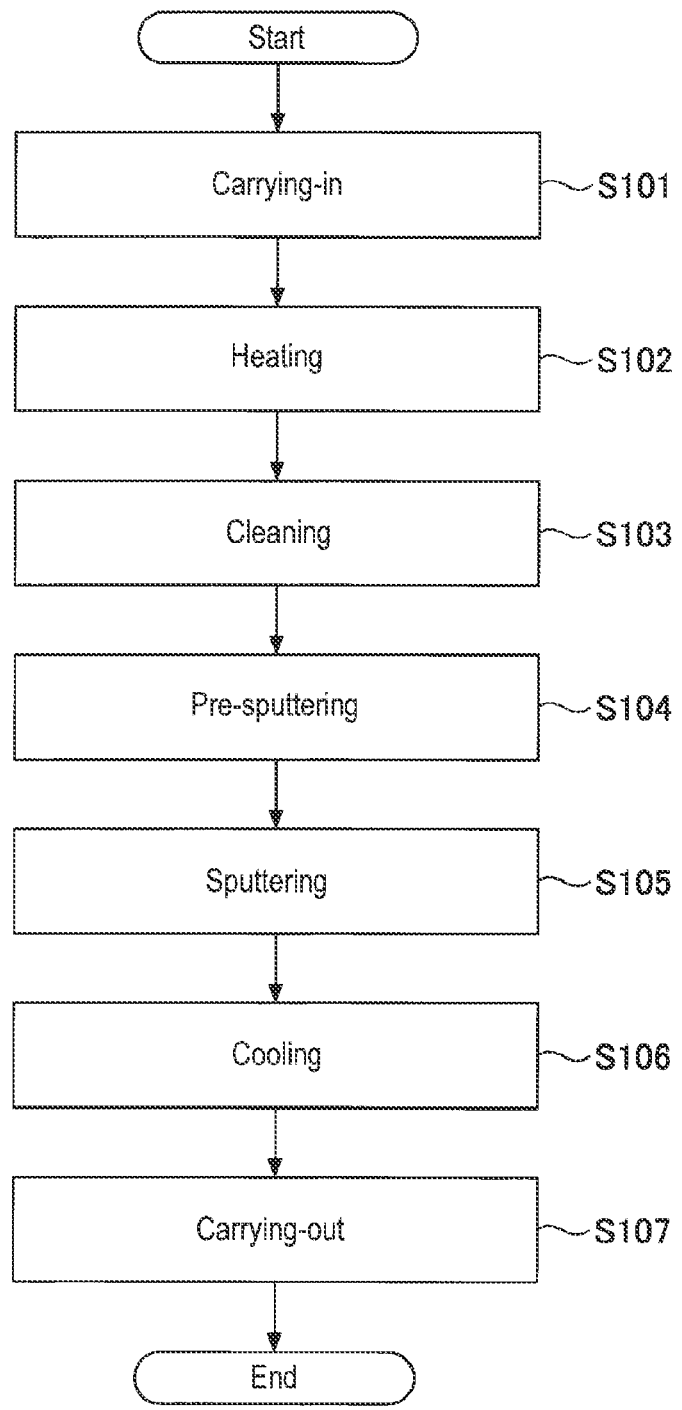
FIG. 2 is a flowchart illustrating a method of forming a gallium nitride film according to an embodiment.
Figure 3:
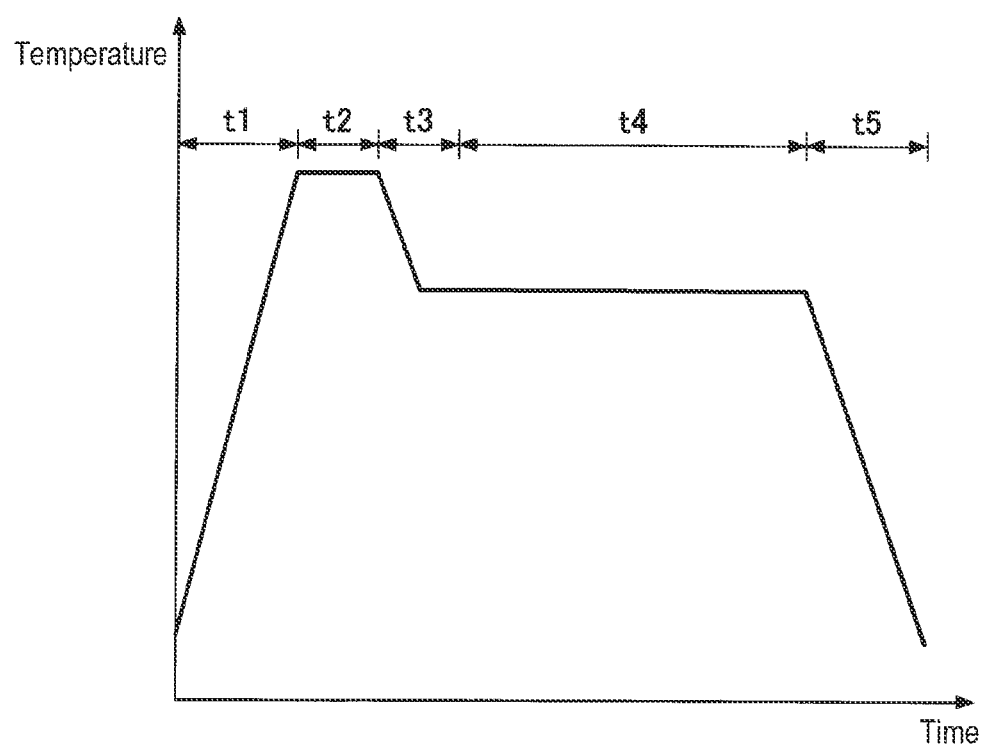
FIG. 3 is a diagram showing a temperature change in the method of forming a gallium nitride film according to the embodiment.

Next, a method of forming a gallium nitride film according to an embodiment using the film forming apparatus 10 will be described. FIG. 2 is a flowchart illustrating the method of forming the gallium nitride film according to the embodiment. FIG. 3 is a diagram showing a temperature change in the method of forming the gallium nitride film according to the embodiment.

The gallium nitride film forming method according to the embodiment includes carrying a wafer W into the vacuum chamber 11 (step S101), heating the wafer W (step S102) and cleaning inside of the vacuum chamber 11 (step S103). The gallium nitride film forming method according to the embodiment further includes performing pre-sputtering (step S104), performing sputtering (step S105), cooling the wafer W (step S106), and carrying the wafer WV out of the vacuum chamber 11 (step S107). Hereinafter, each step will be described in detail.

During standby for step S101, the controller 30 drives the pump P to create a high vacuum in the vacuum chamber 11. For example, pressure in the vacuum chamber 11 may become $10^{-7}$ Pa or lower. Then, in step S101, the wafer W is carried into the vacuum chamber 11 and held by the wafer holder 12. At this time, the wafer holder 12 may be preheated by the heater 14 to a temperature of, for example, 180 degrees C. to 220 degrees C. In some embodiments, ultrasonic cleaning of the wafer W is performed before the wafer W is carried into the vacuum chamber 11. For example, the ultrasonic cleaning is performed using acetone and ethanol, and the ultrasonic cleaning time is set to 5 to 10 minutes.

In step S102, an electric current is supplied to the heater 14 so as to heat the wafer W via the wafer holder 12. The final temperature of the wafer W is, for example, 50 degrees C. higher than a temperature for the film formation. A time period for step S102 corresponds to period t1 in FIG. 3.

In step S103, while maintaining the temperature of the wafer holder 12 at a temperature higher than the film formation temperature by 50 degrees C., a member in the vacuum chamber 11, particularly a member provided in vicinity of the wafer holder 12, is cleaned under a high vacuum. The cleaning time may be, for example, 5 minutes to 15 minutes. A time period for step S103 corresponds to period t2 in FIG. 3.

In step S104, pre-sputtering is performed. Specifically, a temperature of the wafer W is lowered to the film formation temperature, an amount of opening of the valves V21 and V22 is adjusted while the shutter 16 closed, and a DC voltage is applied from the DC power source 15 to a space between the wafer holder 12 and the cathode 13 while a nitrogen gas and an argon gas are supplied into the vacuum chamber 11. In the pre-sputtering, sputtered gallium nitride particles are scattered from the target T, but the sputtered particles do not reach the wafer W because the shutter 16 is closed. During the pre-sputtering, the scattering of sputtered particles from the target T becomes stable. For example, time for the pre-sputtering may be set to 3 minutes to 7 minutes. A time period for step S104 corresponds to period t3 in FIG. 3.

In step S105, sputtering is performed. Specifically, the shutter 16 is opened, and the supply of the nitrogen gas and argon gas and the application of the voltage from the DC power source 15 are continued. In the sputtering, since the shutter 16 is open, sputtered gallium nitride particles scattered from the target T are deposited on the wafer W, and a gallium nitride film grows on the wafer W. In addition, the DC voltage is applied intermittently. That is, pulse sputtering is performed. Details of the film forming conditions, such as the film formation temperature and the atmosphere, will be described later. A time period for step S105 corresponds to period t4 in FIG. 3.

In step S106, the supply of the nitrogen gas and argon gas, the supply of electricity to the heater 14, and the application of the DC voltage are stopped, and the wafer W is cooled. A time period for step S106 corresponds to period t5 in FIG. 3.

In step S107, when the temperature of the wafer W reaches a predetermined temperature, the wafer W is carried out of the vacuum chamber 11.

In this way, it is possible to form the gallium nitride film on the wafer W.

Here, details of the film forming conditions will be described.

(Film Formation Temperature: 560 Degrees C. To 650 Degrees C.)

In the sputtering of step S105, the temperature of the wafer W is set to 560 degrees C. or higher and 650 degrees C. or lower. When the temperature of the wafer W is lower than 560 degrees C. the amount of evaporation of gallium supplied to the surface of the wafer W decreases and thus, the amount of deposition increases relatively. For the excess of gallium, due to insufficient nitridation, unnitrided gallium element remains and is likely to aggregate on the wafer W due to surface diffusion. When the aggregation of gallium occurs, nitrogen is relatively deficient in the gallium nitride film, That is, point defects are likely to occur in the gallium nitride film due to nitrogen deficiency. As a result, crystallinity is low and sufficient optical properties cannot be obtained. Therefore, the temperature of the wafer W is set to 560 degrees C. or higher, preferably 570 degrees C. or higher. On the other hand, when the temperature of the wafer W exceeds 650 degrees C., thermal decomposition of gallium nitride on the wafer W is promoted, and the surface of the gallium nitride film tends to become rough. As a result, sufficient flatness cannot be obtained. Further, the film formation rate may decrease with the thermal decomposition of gallium nitride. Therefore, the temperature of the wafer W is set to 650 degrees C. or lower, preferably 630 degrees C. or lower, and more preferably 610 degrees C. or lower.
(Ratio of Nitrogen Flow Rate: 6% to 18%)

In the sputtering of step S105, a ratio ($R_{N2}$) of a flow rate of the nitrogen to a sum of the flow rate of the nitrogen and a flow rate of the argon is set to 6% or higher and 18% or lower. When the ratio $R_{N2}$ is less than 6%, the nitrogen that reacts with the gallium is insufficient so that the resulting gallium aggregates on the wafer W. and point defects are likely to occur in the gallium nitride film due to the nitrogen deficiency. As a result, sufficient crystallinity cannot be obtained. Therefore, the ratio $R_{N2}$ is set to 6% or higher, preferably 8% or higher. On the other hand, when the ratio $R_{N2}$ exceeds 18%, the gallium is less likely to diffuse on the surface of the wafer W, and the surface of the gallium nitride film is likely to become rough. As a result, sufficient flatness cannot be obtained. Therefore, the ratio $R_{N2}$ is set to 18% or less, preferably 15% or less. The sum of the flow rate of nitrogen and the flow rate of argon is, for example, 50 sccm to 1,000 sccm.

(Pressure: 1.0 Pa or Higher)

In the sputtering of step S105, the pressure in the vacuum chamber 11 (sputtering pressure) is preferably 1.0 Pa or higher. When the sputtering pressure is less than 1.0 Pa, the sputtering particles scattered from the target T may collide with the wafer W at an excessively high speed, thereby causing damage to the wafer W and causing crystal defects. The more crystal defects in the gallium nitride film, the higher the photoluminescence intensity of the yellow band wavelength range. Therefore, the pressure in the vacuum chamber 11 is preferably 1.0 Pa or higher, more preferably 5.0 Pa or higher, and further preferably 10.0 Pa or higher.

(Output Density: 2 W/Cm² to 40 W/Cm²)

In the sputtering of step S105, the output density is preferably set to 2 W/cm² or more to 40 W/cm² or less. When the output density is less than 2 W/cm², it may be difficult to maintain plasma around the target T. Therefore, the output density is set to preferably 2 W/cm² or higher, and more preferably 5 W/cm² or higher. On the other hand, when the output density exceeds 40 WV/cm², the temperature of the target T may become excessively high. Therefore, the output density is set to preferably 40 W/cm² or lower, and more preferably 15 W/cm² or lower. In addition, for example, by setting a pulse-on time to 300 μs or longer and a ratio thereof (duty ratio) to 50% or less, the output density can be set to 2 W/cm² to 40 W/cm².

(Concentration of Impurities in Target T)

Examples of impurities contained in the target T include oxygen (O) and carbon (C). When the concentration of at least one of these impurities exceeds $2.0\times10^{18}$ atoms/cm³, the concentration of impurities in the gallium nitride film that is formed also increases, and the photoluminescence intensity of the yellow band wavelength range increases. Therefore, the concentration of each of the oxygen and carbon of the target T is set to preferably $2.0\times10^{18}$ atoms/cm³ or lower, more preferably $1.0\times10^{17}$ atoms/cm³ or lower, and further preferably $1.0\times10^{16}$ atoms/cm³ or lower.

As the target T, for example, a single crystal or polycrystalline target having a sputtering surface oriented towards a+c axis may be used. Such a single crystal or polycrystalline target may be produced through, for example, a liquid phase growth method or a vapor phase growth method. Examples of the liquid phase growth method include an ammonothermal method and a sodium (Na) flux method. Examples of the vapor phase growth method include a hydride vapor phase epitaxy (HVPE) method and a halogen-free vapor phase epitaxy (HFVPE) method. Density of the target T is preferably 99% or higher. A sintered target of gallium nitride may be used as the target T.

(Vacuum Chamber 11)

For the vacuum chamber 11, in some embodiments, one that can achieve a degree of vacuum of $1\times10^{-5}$ Pa or lower at a growth temperature is preferably used. This is to suppress mixing of impurities generated in the vacuum chamber 11 into the gallium nitride film.

A cathode for attaching a target of a substance that gives a type of conductivity to the gallium nitride film may be provided in the vacuum chamber 11. Examples of the substance that imparts the type of conductivity to the gallium nitride film include magnesium (Mg) and silicon (Si). A p-type GaN film can be formed by adding magnesium, and an n-type GaN film can be formed by adding silicon.

A cathode for attaching a target of a substance having a gallium nitride film as a mixed crystal may be provided in the vacuum chamber 11. Examples of the substance having a gallium nitride film as a mixed crystal include aluminum (Al) and indium (In). When aluminum is contained, an AlGaN film can be formed, and when In is contained, an InGaN film can be formed. That is, the nitride semiconductor film formed by the present disclosure is not limited to the gallium nitride film. The GaN film, AlGaN film, and InGaN film can be used not only for optical devices such as LEDs or the like, but also for electronic devices such as high electron mobility transistors (HEMTs) or the like.

In this way, when the gallium nitride target is intermittently sputtered, the target of the substance to be mixed with the gallium nitride being formed as a film may be intermittently sputtered. The target of magnesium, silicon, aluminum, or indium may be a target of a single substance from these substances, or may be a target of a compound such as a nitride or the like.

(Wafer W)

For the wafer W, in some embodiments, a wafer having a gallium nitride layer of single crystals on a surface, on which the gallium nitride film is to be formed, is preferably used. This is to form a gallium nitride film having satisfactory crystallinity. As the wafer W, for example, a single crystal substrate of gallium nitride, a sapphire substrate having a single crystal template of gallium nitride, or a silicon substrate having a single crystal template of gallium nitride may be used.

Next, a relationship between specific film formation conditions and characteristics of gallium nitride films that are formed will be described. Table 1 shows the relationship between the film formation conditions and the characteristics of gallium nitride films. Further, regarding the characteristics of the gallium nitride films in Table 1, in evaluating the flatness, films having the surface roughness RMS of 0.5 nm or less are indicated as "A", those having the surface roughness RMS of more than 0.5 nm and 1.0 nm or less are indicated as "B", and those having the surface roughness of more than 1.0 nm are indicated as "C". In evaluating optical properties, films having the photoluminescence intensity ratio of the band edge wavelength to the yellow band wavelength range of 50 or higher are indicated as "A", those having the ratio of 10 or higher and lower than 50 are indicated as "B", and those having the ratio of lower than 10 are indicated as "C". In evaluating impurities, films having both the oxygen concentration and the carbon concentration that are $1.0\times10^{18}$ atoms/cm³ or lower are indicated as "A", and those having the oxygen concentration, the carbon concentration, or both the oxygen concentration and the carbon concentration that are higher than $1.0\times10^{18}$ atoms/cm³ are indicated as "B".

TABLE 1

| Condition No. | Film formation temperature (° C.) | Ratio $R_{N2}$ (%) | Gallium nitride target Type | Gallium nitride target Oxygen concentration | Gallium nitride target Carbon concentration (Atom/cm$^3$) | Characteristic of gallium nitride film Flatness | Characteristic of gallium nitride film Optical properties | Characteristic of gallium nitride film Impurity |
|---|---|---|---|---|---|---|---|---|
| 1 | 500 | 10 | Sintering | <1.0 wt % | Unmeasured | C | C | Unmeasured |
| 2 | 550 | 10 | Sintering | <1.0 wt % | Unmeasured | C | C | Unmeasured |
| 3 | 560 | 10 | Sintering | <1.0 wt % | Unmeasured | B | B | Unmeasured |
| 4 | 570 | 10 | Sintering | <1.0 wt % | Unmeasured | A | B | Unmeasured |
| 5 | 580 | 10 | Sintering | <1.0 wt % | Unmeasured | A | B | Unmeasured |
| 6 | 600 | 10 | Sintering | <1.0 wt % | Unmeasured | A | B | B |
| 7 | 610 | 10 | Sintering | <1.0 wt % | Unmeasured | A | B | B |
| 8 | 620 | 10 | Sintering | <1.0 wt % | Unmeasured | B | B | Unmeasured |
| 9 | 630 | 10 | Sintering | <1.0 wt % | Unmeasured | B | B | Unmeasured |
| 10 | 640 | 10 | Sintering | <1.0 wt % | Unmeasured | B | Unmeasured | Unmeasured |
| 11 | 650 | 10 | Sintering | <1.0 wt % | Unmeasured | B | Unmeasured | Unmeasured |
| 12 | 660 | 10 | Sintering | <1.0 wt % | Unmeasured | C | Unmeasured | Unmeasured |
| 13 | 680 | 10 | Sintering | <1.0 wt % | Unmeasured | C | Unmeasured | Unmeasured |
| 14 | 700 | 10 | Sintering | <1.0 wt % | Unmeasured | C | C | Unmeasured |
| 15 | 600 | 5 | Sintering | <1.0 wt % | Unmeasured | B | C | Unmeasured |
| 16 | 600 | 6 | Sintering | <1.0 wt % | Unmeasured | B | B | Unmeasured |
| 17 | 600 | 7.5 | Sintering | <1.0 wt % | Unmeasured | B | B | Unmeasured |
| 18 | 600 | 8 | Sintering | <1.0 wt % | Unmeasured | A | A | Unmeasured |
| 19 | 600 | 10 | Single crystal | <1.0 × 10$^{19}$ Atom/cm$^3$ | <1.0 × 10$^{16}$ | A | A | A |
| 20 | 600 | 12 | Single crystal | <1.0 × 10$^{19}$ Atom/cm$^3$ | <1.0 × 10$^{16}$ | A | A | Unmeasured |
| 21 | 600 | 15 | Sintering | <1.0 wt % | Unmeasured | A | B | Unmeasured |
| 22 | 600 | 18 | Sintering | <1.0 wt % | Unmeasured | B | B | Unmeasured |
| 23 | 600 | 20 | Sintering | <1.0 wt % | Unmeasured | C | B | Unmeasured |

As shown in Table 1, in Condition Nos. 1 and 2, since the film formation temperature is lower than the lower limit, the crystallinity is low due to nitrogen deficiency and thus, sufficient optical properties cannot be obtained. In Condition Nos. 3 to 11, since films are formed under appropriate temperature conditions, good flatness and optical properties can be obtained. In Condition Nos. 4 to 7, since the film formation temperature is within a preferable range, particularly excellent flatness and optical properties can be obtained. In Condition Nos. 12 to 14, since the film formation temperature exceeds the upper limit, thermal decomposition of gallium nitride is promoted and thus, sufficient flatness cannot be obtained.

In Condition No. 15, since the ratio of nitrogen flow rate ($R_{N2}$) is lower than the lower limit, the crystallinity is low due to nitrogen deficiency and thus, sufficient optical properties cannot be obtained. In Condition Nos. 16 to 22, since the films are formed under appropriate conditions, good flatness and optical properties can be obtained. In Condition Nos. 18 to 21, since the ratio $R_{N2}$ is within a preferable range, particularly excellent flatness and optical properties can be obtained. In Condition No. 23, since the ratio $R_{N2}$ exceeds the upper limit, gallium is less likely to diffuse on the surface of the wafer W and thus, sufficient flatness cannot be obtained.

In Condition Nos. 19 and 20, since the oxygen concentration and the carbon concentration of the target are within preferable ranges, particularly excellent flatness and optical properties can be obtained.

Embodiments or the like have been described in detail above, but the present disclosure is not limited to the above-described embodiments or the like, and various modifications and substitutions can be made to the above-described embodiments or the like without departing from the scope set forth in the claims.

The present application claims priority from Basic Application No. 2018-191242 filed with the Japan Patent Office on Oct. 9, 2018, the disclosure of which is incorporated herein in its entirety by reference.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a nitride semiconductor film, the method comprising:
    heating an object to a first temperature;
    pre-sputtering a target of gallium nitride inside a vacuum chamber containing nitrogen and argon after the heating the object, in a state where a shutter disposed between the object and the target is closed;
    intermittently-sputtering the target of the gallium nitride inside the vacuum chamber containing the nitrogen and the argon, in a state where the shutter is opened; and
    depositing intermittently-sputtered particles of the gallium nitride that are scattered from the target inside the vacuum chamber, on the object having a second temperature of 560 degrees C. or higher and 650 degrees C. or lower,
    wherein a ratio of a flow rate of the nitrogen to a sum of the flow rate of the nitrogen and a flow rate of the argon supplied to the vacuum chamber is 6% or higher and 18% or lower, wherein the first temperature is 50 degrees C. higher than the second temperature, and wherein a duration time for the pre-sputtering the target is set to a range of 3 to 7 minutes.

2. The method of claim 1, wherein the second temperature of the object in the depositing the intermittently-sputtered particles is 570 degrees C. or higher and 630 degrees C. or lower.

3. The method of claim 2, wherein the ratio of the flow rate of the nitrogen to the sum of the flow rate of the nitrogen and the flow rate of the argon supplied to the vacuum chamber is 8% or higher and 15% or lower.

4. The method of claim 3, wherein a pressure within the vacuum chamber is 1.0 Pa or higher.

5. The method of claim 4, wherein an output density in the intermittently-sputtering the target is 2 W/cm$^2$ or higher and 40 W/cm$^2$ or lower.

6. The method of claim 5, wherein a concentration of each of oxygen and carbon of the target is $1\times10^{17}$ atoms/cm$^3$ or lower.

7. The method of claim 6, wherein a surface of the target facing the object is oriented towards a c-axis of a crystal contained in the target.

8. The method of claim 7, wherein the object has a gallium nitride layer of single crystals on a surface facing the target.

9. The method of claim 8, further comprising:

in addition to the intermittently-sputtering the target of the gallium nitride, intermittently sputtering a target of a substance to be mixed with the gallium nitride.

10. The method of claim 1, wherein the ratio of the flow rate of the nitrogen to the sum of the flow rate of the nitrogen and the flow rate of the argon supplied to the vacuum chamber is 8% or higher and 15% or lower.

11. The method of claim 1, wherein a pressure within the vacuum chamber is 1.0 Pa or higher.

12. The method of claim 1, wherein an output density in the intermittently-sputtering the target is 2 W/cm$^2$ or higher and 40 W/cm$^2$ or lower.

13. The method of claim 1, wherein a concentration of each of oxygen and carbon of the target is $1\times10^{17}$ atoms/cm$^3$ or lower.

14. The method of claim 1, wherein a surface of the target facing the object is oriented towards a c-axis of a crystal contained in the target.

15. The method of claim 1, wherein the object has a gallium nitride layer of single crystals on a surface facing the target.

16. The method of claim 1, further comprising:

in addition to the intermittently-sputtering the target of the gallium nitride, intermittently sputtering a target of a substance to be mixed with the gallium nitride.

17. The method of claim 1, further comprising:

after the heating the object and before the intermittently-sputtering the target, cleaning a member in the vacuum chamber while maintaining a temperature of the object at the first temperature.

* * * * *